(12) United States Patent
Algotsson et al.

(10) Patent No.: US 7,008,836 B2
(45) Date of Patent: Mar. 7, 2006

(54) METHOD TO PROVIDE A TRIPLE WELL IN AN EPITAXIALLY BASED CMOS OR BICMOS PROCESS

(75) Inventors: Patrik Algotsson, Stockholm (SE); Karin Andersson, Hässelby (SE); Hans Norström, Solna (SE)

(73) Assignee: Infineon Technologies Wireless Solutions Sweden AB, Kista (SE)

( * ) Notice: Subject to any disclaimer, the term of this patent is extended or adjusted under 35 U.S.C. 154(b) by 0 days.

(21) Appl. No.: 10/810,124

(22) Filed: Mar. 26, 2004

(65) Prior Publication Data

US 2004/0219733 A1   Nov. 4, 2004

(30) Foreign Application Priority Data

Mar. 28, 2003   (SE) .................................... 0300924

(51) Int. Cl.
*H01L 21/8238* (2006.01)

(52) U.S. Cl. ................. 438/224; 438/228; 438/202
(58) Field of Classification Search ............. 438/199, 438/202, 222, 223, 224, 234, 228
See application file for complete search history.

(56) References Cited

U.S. PATENT DOCUMENTS

| | | | | |
|---|---|---|---|---|
| 5,470,766 A | * | 11/1995 | Lien | 438/419 |
| 5,776,807 A | * | 7/1998 | Ronkainen et al. | 438/202 |
| 5,780,899 A | * | 7/1998 | Hu et al. | 257/335 |
| 5,880,014 A | | 3/1999 | Park et al. | 438/527 |
| 5,895,251 A | * | 4/1999 | Kim | 438/401 |
| 6,242,793 B1 | * | 6/2001 | Colombo et al. | 257/556 |
| 6,255,153 B1 | * | 7/2001 | Ryoo | 438/217 |
| 6,258,641 B1 | * | 7/2001 | Wong et al. | 438/199 |
| 6,300,209 B1 | * | 10/2001 | Oh | 438/370 |
| 6,366,499 B1 | | 4/2002 | Wang et al. | 365/185.28 |
| 6,525,394 B1 | * | 2/2003 | Kuhn et al. | 257/509 |
| 2003/0020106 A1 | | 1/2003 | Tran | 257/296 |

* cited by examiner

*Primary Examiner*—Trung Dang
(74) *Attorney, Agent, or Firm*—Baker Botts L.L.P.

(57) ABSTRACT

A method to provide a triple well in an epitaxially based CMOS or B:CMOS process comprises the step of implanting the triple well prior to the epitaxial deposition.

16 Claims, 2 Drawing Sheets

METHOD TO PROVIDE A TRIPLE WELL IN AN EPITAXIALLY BASED CMOS OR BICMOS PROCESS

PRIORITY

This application claims priority to Swedish application no. SE0300924-8 filed Mar. 28, 2003.

TECHNICAL FIELD OF THE INVENTION

The invention relates to a method to provide a triple well in an epitaxially based CMOS or BiCMOS process.

BACKGROUND OF THE INVENTION

In a main stream CMOS or BiCMOS process a PWELL/pwell in an NMOS can be implanted in a P/p-type substrate and thereby the biasing of the pwell is common for all the NMOS transistors on a chip. In order to prevent a global biasing, a TRIPLE WELL/triple well option can be used. The use of a triple well is earlier known and a method to provide a triple well has been earlier published, see e.g. U.S. Pat. No. 6,388,295 and Japanese Patent No. 11026601.

The use of a triple well firstly provides an opportunity to have a separate biasing on each NMOS transistor and hence adjust a threshold voltage individually. For an analogue RF and perhaps most desirably for mixed signals circuits the use of a triple well also isolates the NMOS transistors and suppresses noise couplings. There are several benefits, which can be achieved by using a triple well concept. In an integrated circuit a global biasing for a group of transistors can be of advantage.

SUMMARY OF THE INVENTION

The present invention relates to a new method to provide a deep NWELL/n-well such as a triple well. The conventional process flow using triple well has an implanted phosphorous doping deep into the silicon, fabricated by using a high energy implant. This invention instead suggests the use of arsenic doping implanted prior to the deposition of the epitaxial layer. Arsenic is preferable since it diffuses slower than phosphorous and has a better lattice match. Said arsenic is implanted deep into the silicon to minimize its influence on the transistor parameters. The depth of a subsequent p-well implant after an epitaxial deposition of the NMOS transistor determines the depth of the triple well implant. The method is preferably intended for a Shallow Trench Isolated (STI) process. The depth of the STI must not reach this arsenic implanted triple well. This means that some additional N-type doping must be introduced to cut the path beneath the STI. This can be made using an additional N implant in sequence with the triple well implant prior to an/the epitaxial deposition. The standard nwell implant of the PMOS transistor may also be used to cut this path. This nwell implant is performed after the STI etch and fill. The energy is chosen in such a way that the N-type doping will reach the area underneath the STI and together with the deep nwell form a good isolation of the PMOS transistor.

A method to provide a triple well in an epitaxially based CMOS or BiCMOS process, thus comprises the step of implanting the triple well prior to the epitaxial deposition.

The method may comprise the step of using arsenic when implanting the triple well, wherein a slow diffusion will occur. The method may further comprise the step of adding at least one NMOS device in an achieved structure. The method may further comprise the step of implanting Boron prior to the epitaxial deposition. The method may further comprise the step of adding more than one NMOS device in an achieved structure.

A method to provide a triple well in an epitaxially based CMOS or BiCMOS process, may comprise the steps of:
providing a semiconductor substrate;
applying a first mask having openings only in areas for said triple well;
applying an ion implant;
applying a second mask having openings surrounding said ion implant;
implanting a first trench surrounding said ion implant;
depositing an epitaxial layer.

The ion implant can be an arsenic ion implant. A doping dose of $2 \times 10^{13}$ cm$^{-2}$, energy of 480 keV and a tilt angle of 0 degree may be used to penetrate deep into the substrate. The method may further comprising the steps of providing a third mask on top of said epitaxial layer before depositing said epitaxial layer, and implanting at least a second trench. The method may further comprise the step of etching said epitaxial layer to provide third trenches above said first and second trenches. The third trenches can be filled by a dielectric material. The dielectric material may be a High Density Plasma oxide. The method may further comprise the step of planarizing said epitaxial layer. The planarizing can be performed by chemical and/or mechanical polishing. The substrate can be of p-type and the triple well and first trenches can be of n-type.

This process sequence may easily be added to a standard CMOS/BiCMOS process flow. By using this concept it will be possible to have a group of NMOS transistors in one and the same island, isolated from its surrounding. This invention even states that a group of NMOS transistors, which will have the same biasing should be surrounded by the standard NWELL implant or an additional N type implant prior to the epitaxial deposition.

Depending on type or process, the resistivity p-type path under the STI could be high, which requires short distance between p-well contacts. To be able to increase this distance an additional p-type implant can be introduced prior to the epitaxial deposition in the same way as the deep well/DEEP NWELL implant. This implant must be optimized in such way that it does not cut through the triple well/TRIPLE WELL implant and establish a conductive path to the substrate. The p-well of the NMOS transistor may be designed in such a way that it reaches deeper than the STI depth and thereby decrease the resistance of the current path underneath the STI.

PREFERRED EMBODIMENTS OF THE INVENTION

In order to understand the present invention a particular example will be described. Details known by persons skilled in the art are omitted. The following description is a sequence of process steps and can be dropped into a main stream CMOS or BiCMOS process as a separate module. No details are given about the flow before or after those process steps. The alignment marks are also assumed to be made in an earlier step and can be used in the described sequence.

Figure 1:
FIG. 1 is a sectional view of a p-type substrate.

In FIG. 1 there is shown a sectional view of a p-substrate 1. The doping level for the substrate is chosen depending on the application for the circuit. The concept will not be affected by the choice of resistivity as long it is high ohmic.

Figure 2:
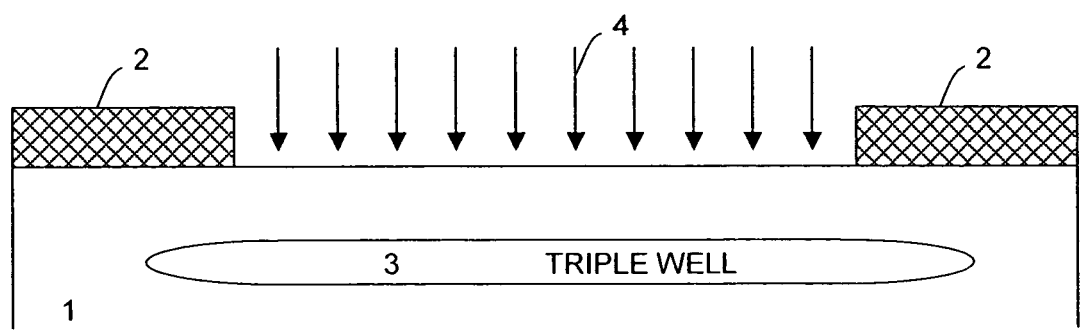
FIG. 2 is a sectional view of the p-type substrate with an implanted triple well according to the invention.

On this starting material a sequence of three implantations prior to an epitaxial deposition will follow. A first mask 2 is applied to achieve a triple well 3 in preferable areas. The mask 2 has openings only in areas right above those areas. Using this patterned resist 2 as a mask an ion implant 4 of arsenic is followed. This implant 4 having a suggested doping dose of $2 \times 10^{13}$ cm$^{-2}$, energy of 480 keV and a tilt angle of 0 degree penetrate deep into the substrate. In FIG. 2 the step is shown of this implant and the achieved triple well region 3.

Figure 3:
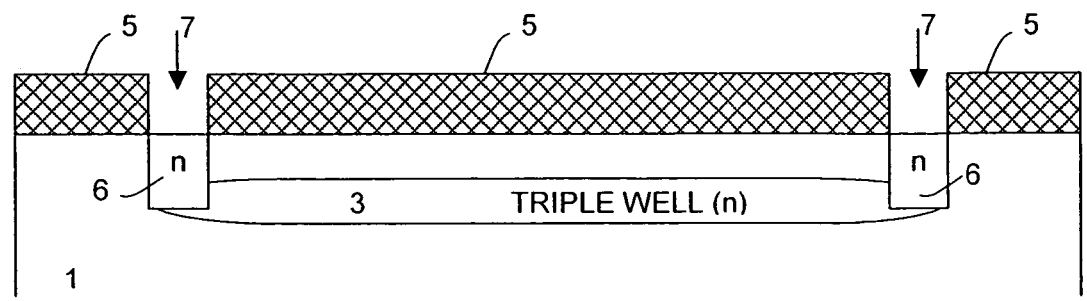
FIG. 3 is a sectional view of the p-type substrate with the implanted triple well according to the invention, where an implantation of n-type dopant is shown.

A next mask step 5 is made to mask an additional n-type implant 6 that will surround the device or group of devices in a same island. This implant must be made in such a way that no p-type will remain under a STI 12a in implanted areas. It must also connect to the triple well to make sure that no p-type region will separate this implant from the triple well. In FIG. 3 the implantation of this n-type dopant is shown.

Figure 4:
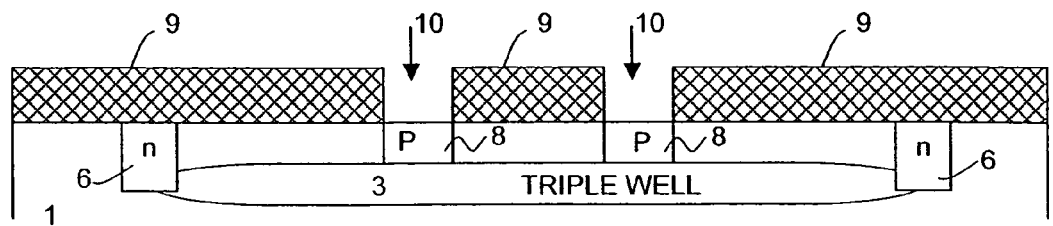
FIG. 4 is a sectional view of the p-type substrate with the implanted triple well according to the invention, where an implantation of a p-type dopant is shown.

A last doping 8 is aimed to end up under the STI 12b that will be performed later in the process flow. It will have a separate patterned resist mask 9. The dose and the energy of this implant was chosen so it reaches the triple well 3. It should be as high as possible but still not cut the triple well 3. Even lateral diffusion that might have impact on design rules must be taken under consideration when the dose and energy are to be determined. When the design rules are set the implantation should be optimised in such a way that the resistivity for current path under the STI should be minimised. In FIG. 4 the implantation of this p-type doping is shown.

This description gives those three implants a particular sequence. But any permutation in the order of the implantation can be made and still the wanted structure can be achieved.

Figure 5:
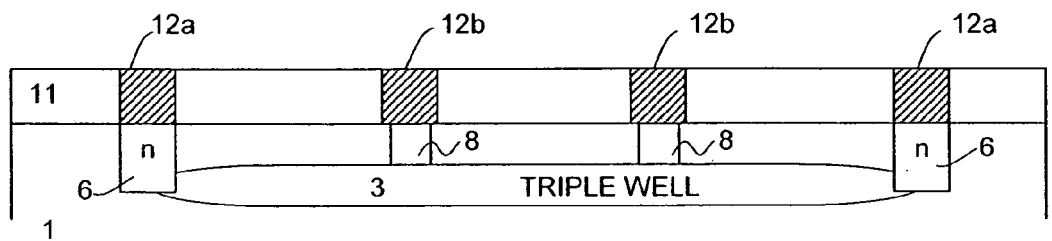
FIG. 5 is a sectional view of the p-type substrate with the implanted triple well according to the invention, where an isolation between achieved different islands is shown.

After those three masked implantations an epitaxial growth will be performed. A masked etch into the silicon will follow into this epitaxial layer. Obtained trenches will be filled by a dielectric material, as High Density Plasma oxide (HDP), and then planarized by chemical and/or mechanical polishing CMP. Those boxes, STI 12, will provide the isolation between the devices in the process as shown in FIG. 5. So far no absolute number of depth and thickness has been mentioned. The reason is that this concept will work in a wide range for those numbers. But the following condition is required to make the concept to work. The epitaxial thickness, STI depth and the depth of said three implantations must be related to each other as follow. The STI should not reach the triple well. The p-type should not be implanted in the area where the n-type will be implanted. The surrounding n-type must reach the triple well and cut all p-type under the STI in implanted areas. The triple well must be deep enough to not have any major impact on the behaviour of the transistor.

The numbers of mask step are a figure of the complexity of the technology. In this sequence three additional layers are included to the basic process flow. To reduce this to only one extra mask, p-well implantations can be used instead of 8 and nwell or buried collector can be used instead of 6 and this will reduce the processing cost.

Figure 6:
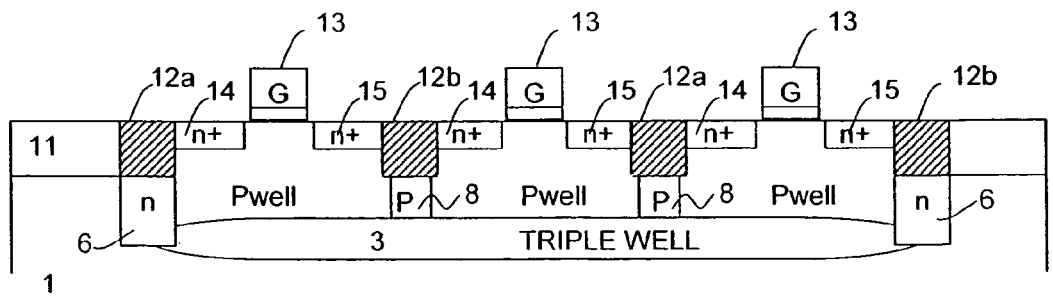
FIG. 6 is a sectional view of the p-type substrate with the implanted triple well according to the invention with three NMOS transistors.

In this achieved structure a conventional NMOS devise can be created by conventional main stream CMOS or BICMOS flow. In FIG. 6 cross sections of three NMOS transistors are shown. Terminals to p-well 6 and triple well 3 are not visible in the view. Drain 14, source 15 and gate 13 can be seen in the figure. If a single device will be biased separately the additional p-type implant is not necessary. In that case the surrounding STI 12a is the same STI as the STI 12b, that isolate the device, which means that the additional n-type implant will be under the same STI as the STI isolating the device. In the case when more than one device will be made within the same island this additional n-type will only be under the surrounding STI. The p-type will be under the STI captured by this surrounding STI and n-type implant.

What is claimed is:

1. A method to provide a triple well in an epitaxially based CMOS or BiCMOS process, comprising the step of implanting the triple well using arsenic prior to the epitaxial deposition wherein a slow diffusion will occur, and implanting Boron prior to the epitaxial deposition.

2. The method according to claim 1, comprising the step of adding more than one NMOS device in an achieved structure.

3. A method to provide a triple well in an epitaxially based CMOS or BiCMOS process, comprising the steps of:
   providing a semiconductor substrate;
   applying a first mask having openings only in areas for said triple well;
   applying an ion implant;
   applying a second mask having openings surrounding said ion implant;
   implanting a first area surrounding said ion implant;
   depositing an epitaxial layer,
   providing a third mask on top of said substrate before depositing said epitaxial layer, and
   implanting at least a second area.

4. The method according to claim 3, wherein the ion implant is an arsenic ion implant.

5. The method according to claim 3, wherein a doping dose of $2 \times 10^{13}$ cm$^{-2}$, energy of 480 keV and a tilt angle of 0 degree is used to penetrate deep into the substrate.

6. A method to provide a triple well in an epitaxially based CMOS or BiCMOS process, comprising the steps of:
   providing a semiconductor substrate;
   applying a first mask having openings only in areas for said triple well;
   applying an ion implant;
   applying a second mask having openings surrounding said ion implant;
   implanting a first area surrounding said ion implant;
   depositing an epitaxial layer; and
   etching said epitaxial layer to provide third areas above said first areas.

7. The method according to claim 6, wherein the third areas are filled by a dielectric material.

8. The method according to claim 7, wherein the dielectric material is a High Density Plasma oxide.

9. The method according to claim 3, further comprising the step of etching said epitaxial layer to provide third areas above said first and second trenches.

10. The method according to claim 9, wherein the third areas are filled by a dielectric material.

11. The method according to claim 10, wherein the dielectric material is a High Density Plasma oxide.

12. The method according to claim 6, further comprising the step of planarizing said epitaxial layer.

13. The method according to claim 12, wherein the planarizing is performed by chemical and/or mechanical polishing.

14. The method according to claim 3, wherein the substrate is of p-type and the triple well and first areas are of n-type.

15. A method to provide a triple well in an epitaxially based CMOS or BiCMOS process, comprising the step of implanting the triple well prior to the epitaxial deposition, implanting Boron prior to the epitaxial deposition, and adding at least one NMOS device in an achieved structure.

16. The method according to claim 15, comprising the step of adding more than one NMOS device in an achieved structure.

* * * * *